United States Patent [19]

Takeuchi et al.

[11] Patent Number: 4,842,897
[45] Date of Patent: Jun. 27, 1989

[54] METHOD FOR FORMING DEPOSITED FILM

[75] Inventors: Eiji Takeuchi; Jun-Ichi Hanna, both of Yokohama; Isamu Shimizu, Yokohama; Masaaki Hirooka, Toride; Akira Sakai, Yokohama; Masao Ueki, Urayasu, all of Japan

[73] Assignee: Canon Kabushiki Kaisha, Tokyo, Japan

[21] Appl. No.: 947,036

[22] Filed: Dec. 29, 1986

[30] Foreign Application Priority Data

Dec. 28, 1985 [JP] Japan .................................. 60-298047
Jan. 14, 1986 [JP] Japan ..................................... 61-4369
Jan. 14, 1986 [JP] Japan ..................................... 61-4374

[51] Int. Cl.$^4$ .......................................................... C23C 16/00
[52] U.S. Cl. ................................... 427/255.2; 156/646; 427/255; 427/255.3; 427/307; 427/309; 437/225; 437/228; 437/234
[58] Field of Search ................. 427/255.2, 255.3, 255, 427/95, 255.1, 87, 248.1, 86, 85, 307, 309; 156/646; 437/225, 228, 233, 234, 235, 241

[56] References Cited

U.S. PATENT DOCUMENTS

| | | | |
|---|---|---|---|
| Re. 31,708 | 10/1984 | Gordon | 427/126.2 |
| 3,473,978 | 10/1969 | Jackson et al. | 427/255.7 |
| 3,888,705 | 6/1975 | Fletcher et al. | 148/175 |
| 4,146,657 | 3/1979 | Gordon | 427/126 |
| 4,239,811 | 12/1980 | Kemlage | 427/95 |
| 4,357,179 | 11/1982 | Adams et al. | 427/95 |
| 4,402,762 | 9/1983 | John et al. | 427/87 |
| 4,421,592 | 12/1983 | Shaskus et al. | 156/613 |
| 4,448,801 | 5/1984 | Fukuda et al. | 427/87 |
| 4,462,847 | 7/1984 | Thompson et al. | 148/174 |
| 4,504,518 | 3/1985 | Ovshinsky et al. | 427/86 |
| 4,522,663 | 6/1985 | Ovshinsky et al. | 427/86 |
| 4,532,199 | 7/1985 | Ueno et al. | 430/128 |
| 4,554,180 | 11/1985 | Hirooka | 427/248.1 |
| 4,615,905 | 10/1986 | Ovshinsky et al. | 427/86 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/87 |
| 4,652,463 | 3/1987 | Peters | 427/53.1 |
| 4,657,777 | 4/1987 | Hirooka | 427/39 |
| 4,689,093 | 8/1987 | Ishihara et al. | 437/5 |

FOREIGN PATENT DOCUMENTS

| | | | |
|---|---|---|---|
| 74212 | 3/1983 | European Pat. Off. | 427/248.1 |
| 90586A | 10/1983 | European Pat. Off. | 427/38 |
| 59-199035 | 12/1984 | Japan | 427/38 |
| 60-43819 | 8/1985 | Japan | 427/38 |
| 203086 | 7/1980 | United Kingdom | 427/87 |
| 2148328 | 5/1985 | United Kingdom | 427/255.2 |

OTHER PUBLICATIONS

Brodsky et al., 22 IBM Technical Disclosure Bulletin 3391 (Jan. 1980).
Inoue, Appl. Phys. Lett. 43(8), Oct. 10, 1983, p. 774.
Ohnishi et al., Proceedings, 6th E.C. Photovoltaic Solar Energy Conference, London, Apr. 15-19, 1985.
Sakai et al., Proceedings, 6th E.C. Photovoltaic Solar Energy Conference, London, Apr. 15-19, 1985.

Primary Examiner—Sadie Childs
Attorney, Agent, or Firm—Fitzpatrick, Cella, Harper & Scinto

[57] ABSTRACT

A method for forming deposited film by introducing into a reaction space a gaseous starting material for formation of a deposited film and a gaseous halogenic oxidizing agent having the property of oxidation action for said starting material to effect chemical contact therebetween to thereby form a plural number of precursors including precursors under excited state, and forming said deposited film on a substrate previously position in a film forming space spatially communicated with said reaction space with the use of at least one precursor of these precursors as the feeding source for the constituent element of said deposited film, said method comprising the step of increasing the proportion of the amount of said gaseous starting material introduced relative to the amount of said gaseous halogenic oxidizing agent introduced in said reaction space.

12 Claims, 9 Drawing Sheets

METHOD FOR FORMING DEPOSITED FILM

BACKGROUND OF THE INVENTION

1. Field of the Invention

This invention relates to a method for formation of a deposited film which is applied for production of electronic devices such as photoconductive member for electrophotography, electronic devices such as semiconductor devices such as optical input sensor device for optical image inputting device, thin film transistor, etc., and the like.

2. Related Background Art

In the prior art, for amorphous or polycrystalline deposited films to be used for electronic devices such as semiconductor devices, etc., individually suitable film forming methods have been employed from the standpoint of the desired physical characteristics, uses, etc.

For example, for formation of silicon deposited films such as amorphous or polycrystalline non-single crystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si (H,X)" when indicating a polycrystalline silicon) (the so-called microcrystalline silicon is included within the category of A-Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in formation of a silicon-based deposited film according to the plasma CVD method which has been generalized in the prior art is considerably complicated as compared with the conventional CVD method, and its reaction mechanism involves a great many complex steps. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). By combination of such a large number of parameters, the plasma may sometimes become unstable state, whereby marked deleterious influences were exerted frequently on the deposited film formed. Besides, the parameters characteristic of the device must be selected for each device and therefore under the present situation it has been difficult to generalize the production conditions.

On the other hand, for the silicon-based deposited film to exhibit sufficiently satisfactory electric and optical characteristics for respective uses, it is now accepted that it is form the film according to the plasma CVD method.

However, depending on the application use of the silicon-based deposited film, bulk production with reproducibility must be attempted with full satisfaction of enlargement of area, uniformity of film thickness as well as uniformity of film quality, and therefore in formation of a silicon-based deposited film according to the plasma CVD method, enormous installation investment is required for a bulk production device and also management items for such bulk production becomes complicated, with management being difficult and the control of the device being complex. These are pointed as the problems to be improved in the future.

Also, in the case of the plasma CVD method, since plasma is directly generated by high frequency or microwave, etc., in the film forming space in which a substrate on which film is formed is arranged, electrons or a number of ion species generated may cause damage to the film in the film forming process to cause lowering in film quality or non-uniformization of film quality.

As an improvement of this point, the indirect plasma CVD method has been proposed.

The indirect plasma CVD method has been elaborated to use selectively the effective chemical species for film formation by forming plasma by microwave, etc., at an upstream position apart from the film forming space and transporting the plasma to the film forming space.

However, even by such a plasma CVD method, transport of plasma is essentially required and therefore the chemical species effective for film formation must have long life, whereby the gas species which can be employed are inevitably limited, thus failing to give various deposited films. Also, enormous energy is required for generation of plasma, and generation of the chemical species effective for film formation and their amounts cannot be essentially placed under simple management. Thus, various problems remain to be solved.

As contrasted with the plasma CVD method, the optical CVD method is advantageous in that no ion species or electrons are generated which cause damage to the film quality during film formation. However, there are problems such that the light source does not include so much kinds, that the wavelength of the light source tends to be toward UV-ray side, that a large scale light source and its power source are required in the case of industrialization, that the window for permitting the light from the light source to be introduced into the film forming space is coated with a film during film formation resulting in a lowering in the amount of light during film formation, which may further lead to shut-down of the light from the light source into the film forming space.

Also, in formation of a silicon-based deposited film, for obtaining sufficient device characteristics to stand practical application and also improving yield, it is necessary to clean sufficiently or smoothen the surface of the substrate for formation of a deposited film thereon.

However, before placing the substrate, subjected previously to pre-treatment such as by washing and smoothing the film forming space for formation of a deposited film, the above substrate may be contaminated again or the surface may be damaged, whereby there can be the problem that a deposited film without good device characteristics may be formed.

As described above, in formation of a silicon based deposited film, the points to be solved still remain, and it has been earnestly desired to develop a method for forming a deposited film which is capable of bulk production by attempting to effect energy saving by means of a device of low cost, while maintaining good film characteristics including uniformity to a practical level. These are also applicable for other deposited films such as silicon nitride films, silicon carbide films, silicon oxide films as the similar problems which should be solved respectively.

On the other hand, etching of semiconductor layers in the methods for forming electronic devices of the prior art includes the liquid phase etching (wet etching) and the gas phase etching (dry etching).

The liquid phase etching is carried out by dipping a electronic device into an etching solution with the necessary portion thereof being masked and removing the portion other than the masked portion by etching through the chemical reaction. However, due to insufficient adhesion of the mask and impregnation of the etching solution, there was involved the problem that unnecessary portions were also etched.

On the other hand, the gas phase etching may be typically plasma etching. Particularly, the system in which plasma etching and the sputtering effect are utilized in combination is capable of control of selective etching ratio or anisotropic etching, etc. through the action of the reactive gas and the sputtering action, and therefore it is now becoming predominant as the etching technique for minute working.

However, even in the gas phase etching, masking is also required similarly as in the liquid phase etching, whereby the steps for carrying out patterning and separation of semiconductor layers, etc. are increased and bulk productivity cannot be improved. Also, there was involved the problem that management of film quality was complicated.

SUMMARY OF THE INVENTION

It is, therefore, an object of the present invention to provide a novel method for forming a deposited film which can solve the problems of the prior art deposited film formation methods as described above.

Another object of the present invention is to provide a method for forming a deposited film by which simplification of management and bulk production can be effected with full satisfaction of enlargement of area, uniformity of film thickness and uniformity of film quality simultaneously with conservation of energy, without requiring an enormous installation investment for bulk production apparatus, and also the management items for its bulk production permit easier management tolerance and easier control of the device.

Still another object of the present invention is to provide a method for forming a deposited film by which it is possible to produce an electronic device comprising a semiconductor film, which is excellent in productivity and bulk productivity, and of high quality, having excellent physical characteristics such as electrical, optical, semiconductor characteristics, etc.

Yet another object of the present invention is to provide a method for forming a semiconductor layer in a vacuum chamber and removing the semiconductor from the vacuum chamber contact with the outer atmosphere.

According to the first aspect of the present invention, there is provided a method for forming a deposited film by introducing into a reaction space a gaseous starting material for formation of a deposited film and a gaseous halogenic oxidizing agent having the property of oxidation action on said starting material to effect chemical contact therebetween to thereby form a plural number of precursors including precursors in an excited state, and forming said deposited film on a substrate previously positioned in a film forming space spatially communicated with said reaction space with the use of at least one precursor of these precursors as the feeding source for the constituent element of said deposited film, said method comprising the step of increasing the proportion of the amount of said gaseous starting material introduced relative to the amount of said gaseous halogenic oxidizing agent introduced in said reaction space.

According to the second aspect of the present invention, there is provided a method for forming a deposited film which comprises introducing into a reaction space a gaseous starting material for formation of a deposited film and a gaseous halogenic oxidizing agent having the property of oxidation action for said starting material to effect chemical contact therebetween to thereby form a plural number of precursors including precursors in an excited state, and forming said deposited film to a desired thickness on a substrate previously positioned in a film forming space spatially communicated with said reaction space with the use of at least one precursor of these precursors as the feeding source for the constituent element of said deposited film and then relatively increasing the proportion of the amount of said gaseous starting material introduced to the amount of said gaseous halogenic oxidizing agent introduced in said reaction space to thereby effect etching of the surface of said deposited film.

According to the third aspect of the present invention, there is provided a method for preparing a semiconductor device having at least one layer of semiconductive deposited film which comprises: introducing into a reaction space a gaseous starting material for formation of a deposited film and a gaseous halogenic oxidizing agent having the property of oxidation action on said starting material to effect chemical contact therebetween to thereby form a plural number of precursors including precursors under excited state, and forming said deposited film on a substrate previously positioned in a film forming space spatially communicated with said reaction space with the use of at least one precursor of these precursors as the feeding source for the constituent element of said deposited film; and subsequently bringing either said gaseous halogenic oxidizing agent or a gas mixture with a greater ratio of said gaseous halogenic oxidizing agent than said gaseous starting material into contact with said deposited film at a limited region to thereby separate said deposited film with a desired pattern by etching action through the oxidative reaction of the material constituting said deposited film and said gaseous halogenic oxidizing agent.

DESCRIPTION OF THE PREFERRED EMBODIMENTS

Figure 1:
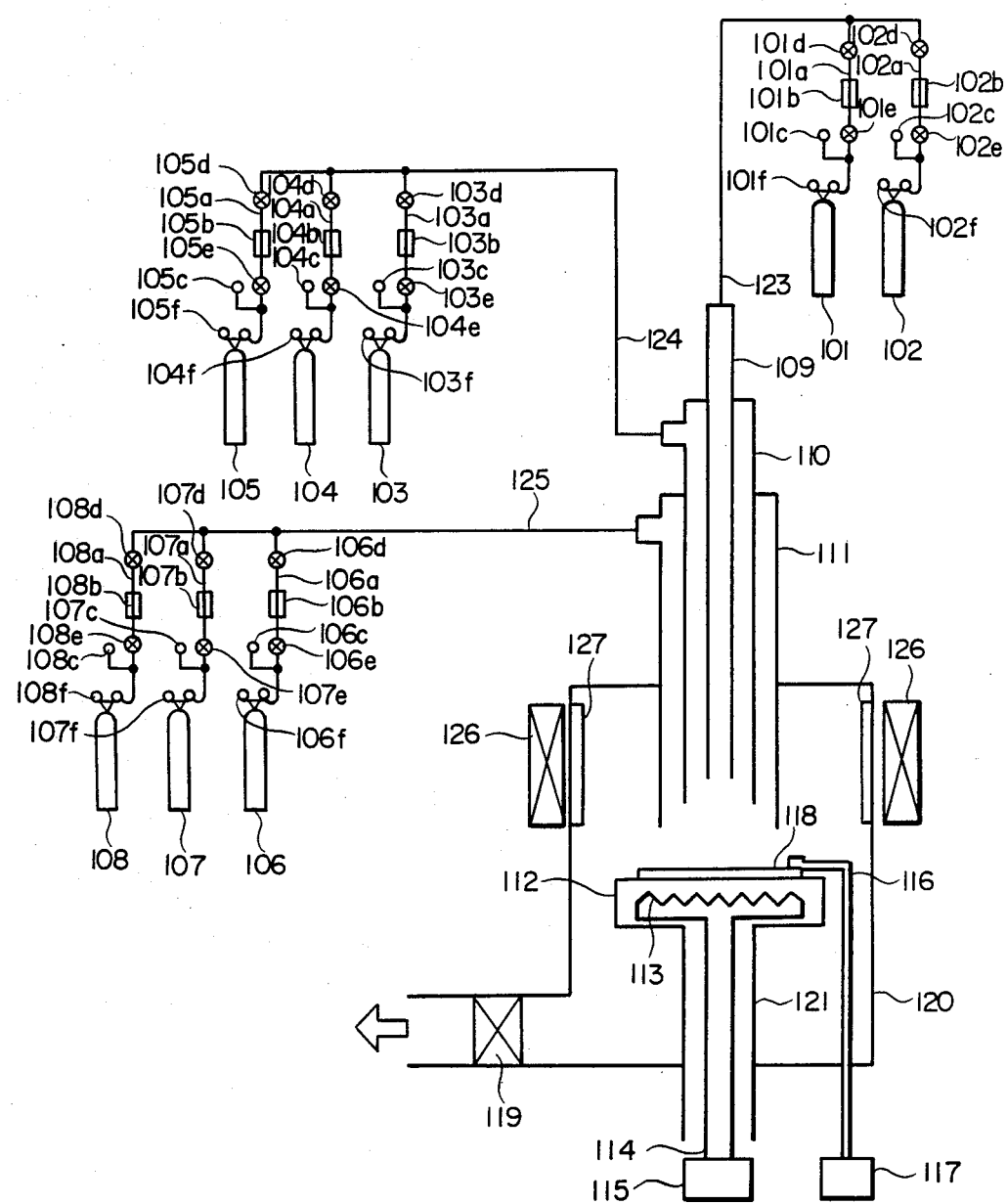
FIG. 1 is a schematic illustration of the constitution of a device for forming a deposited film according to the present invention.

In the present invention, the gaseous starting material to be used for formation of a deposited film receives oxidizing action through chemical contact with a gaseous halogenic oxidizing agent and can be selected suitably as desired depending on the kind, the characteristic, use, etc., of the desired deposited film. In the present invention, the above gaseous starting material and the gaseous halogenic oxidizing agent may be those which can be made gaseous in chemical contact, and they can be either liquid or solid in their ordinary state.

When the starting material for formation of a deposited film or a halogenic oxidizing agent is liquid or solid, the starting material for formation of a deposited film and the halogenic oxidizing agent are introduced in a gaseous state into the reaction space while performing bubbling with the use of carrier gas such as Ar, He, $N_2$, $H_2$, etc., with the option of applying heat.

During this operation, the partial pressures and mixing ratio of the above gaseous starting material and the gaseous halogenic oxidizing agent may be set by controlling the flow rate of the carrier gas or the vapor pressures of the starting material for formation of a deposited film and the gaseous halogenic oxidizing agent.

As the starting material for formation of a deposited film to be used in the present invention, for example, if tetrahedral type deposited films such as semiconductive or electrically insulating silicon-based deposited films or germanium-based deposited films, etc., are desired to be obtained, straight chain and branched chain silane compounds, cyclic silane compounds, chain germanium compounds, etc., may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, and examples of chain germanium compounds include $Ge_mH_{2m+2}$ (m=1, 2, 3, 4, 5), etc. Otherwise, for example, if deposited films of tin are desired to be prepared, hydrogenated tin such as $SnH_4$, etc., may be employed as effective starting material.

Of course, these starting materials may be used either as a single kind or as a mixture of two or more kinds.

The halogenic oxidizing agent to be used in the present invention is made gaseous when introduced into the reaction space and at the same time has the property of effectively oxidizing the gaseous starting material for formation of a deposited film introduced into the reaction space by mere chemical contact therewith, and also has the property of oxidation action for the substrate for formation of a deposited film thereon includes halogenic gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material for formation of a deposited film as described above with desired flow rate and feeding pressure being given. In the case where the ratio of the halogenic oxidizing agent introduced is higher than a prescribed value, the substrate placed in the reaction space receives the oxidation action of the oxidizing agent to have the surface thereof etched. In forming a deposited film, the ratio of the amount of the starting material introduced to the amount of the gaseous halogenic oxidizing agent introduced is increased to exceed a prescribed value. In this case, the halogenic oxidizing agent is mixed with and collided against the starting material to be chemically contacted therewith, thereby exerting oxidation action upon the starting material to generate efficiently plurality of precursors containing precursors in an excited state. Of the precursors under excited state and other precursors generated, at least one of them function as the feeding source for the constitutent element of the deposited film formed.

The precursors generated may undergo decomposition or reaction to be converted to other precursors in an excited state or to precursors under another excited state, or alternatively in their original forms, if desired, although releasing energy to contact the substrate surface arranged in a film forming space, whereby a deposited film with a three-dimensional network structure is prepared.

The energy level to which the precursor is to be excited is preferred to be an energy level such that luminescence is observed in the process in which the precursor in the above excited state is subjected to energy transition to a lower energy level, or alternatively in the process in which it is changed to another chemical species. By formation of an activated precursor including the precursor in an excited state accompanied with luminescence in such a transition of energy, the deposited film forming process of the present invention proceeds with better efficiency and more conservation of energy to form a deposited film having uniform and better physical characteristics over the whole film surface.

In the present invention, so that the deposit film forming process may proceed smoothly to form a film of high quality and having desired physical characteristics, as the film forming factors, the kinds and combination of the starting material and the halogenic oxidizing agent, the mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the amount ratio of the gaseous starting material for formation of a deposited film and the gaseous halogenic oxidizing agent introduced into the reaction space and mixed therein may be determined suitably as determined in relationship of the film forming factors related among the film forming factors as mentioned above, but it is preferably 1/80 to 100/1, more preferably 1/50 to 50/1, and optimally 1/20–50/1 in terms of flow rate ratio introduced into the reaction space.

In the present invention, the above flow rate ratio introduced during etching of the substrate for formation of a deposited film or the deposited film already formed may be determined suitably depending on the purposes, but may be suitably 0 to 1/100, more preferably 0 to 1/300.

The pressure during mixing when introduced into the reaction space may be preferably higher in order to enhance the chemical contact between the above gaseous starting material and the above gaseous halogenic oxidizing agent in probability, but it is better to determine the optimum value suitably as desired in view of the reactivity. Although the pressures during mixing may be determined as described above, each of the pressure during introduction may be preferably $1 \times 10^{-7}$ atm to 10 atm, more preferably $1 \times 10^{-6}$ atm to 3 atm.

The pressure within the film forming space, namely the pressure in the space in which the substrate for film formation on its surface is arranged may be set suitably as desired so that the precursors (E) under excited state generated in the reaction space and sometimes the precursors (D) formed as secondary products from the precursors (E) may contribute effectively to film formation.

The inner pressure in the film forming space, when the film forming space is continuously open to the reaction space, can be controlled in relationship with the introduction pressures and flow rates of the gaseous starting material for formation of a deposited film and a gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure of the film forming space can be controlled by providing an appropriate evacuating device in the film forming space and controlling the evacuation amount of the device.

On the other hand, when the reaction space and the film forming space is integrally made and the reaction position and the film forming position are only different in space, it is possible to effect differential evacuation or provide a large scale evacuating device having sufficient evacuating capacity as described above.

As described above, the pressure of the film forming space may be determined in relationship to the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement of the gas introducing inlet, the substrate and the gas evacuating outlet so that the starting material for formation of a deposited film and the halogenic oxidizing agent may be efficiently mixed during introduction of these into the reaction space, the above precursors (E) may be efficiently generated and film formation may be adequately done without trouble. A preferable example of the geometric arrangement is shown in FIG. 1.

As the substrate temperature (Ts) during film formation, it can be set suitably as desired individually depending on the gas species employed and the kinds and the required characteristics of the deposited film formed, but, in the case of obtaining an amorphous film, it is preferably from room temperature to 450° C., more preferably from 50° to 400° C. Particularly, in the case of forming a silicon-based deposited film with better semiconductor characteristics and photoconductive characteristics, etc., the substrate temperature (Ts) should desirably be made 70° to 350° C. On the other hand, in the case of obtaining a polycrystalline film, it should preferably be 200° to 650° C., more preferably 300° to 600° C.

As the atmosphere temperature (Tat) in the film forming space, it may be determined suitably as desired in relationship with the substrate temperature (Ts) so that the above precursors (E) generated and the above precursors (D) are not changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, Nb, Ta, V, Ti, Pt, Pd, etc. or alloys thereof.

As insulating substrates, the following may be used: films or sheets of synthetic resins, including polyester, polyethylene, polycarbonate, cellulose acetate, polypropylene, polyvinyl chloride, polyvinylidene chloride, polystyrene, polyamide, etc., glasses, ceramics and so on. At least one side surface of these substrates is preferably subjected to treatment for imparting electroconductivity, and it is desirable to provide other layers on the side at which the electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with the metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion property between both is great, a large amount of strains may be created within the film resulting in a film of bad quality, and therefore it is preferable to use a substrate such that the difference in thermal expansion property between both is small. Also, in the present invention, since the surface state of the substrate is directly related to the structure of the film (orientation) or generation of a stylet structure, a substrate is placed in the reaction space so as to give a film structure and a film texture so that desired characteristics may be obtained, the gases in the reaction space are evacuated by an evacuation device, and thereafter both of the gaseous material (A) for formation of a deposited film and the gaseous halogenic oxidizing agent (B) having the property of oxidation action for the starting material (A) and the substrate or only the halogenic oxidizing agent (B) is introduced into the reaction space to effect etching of the substrate. By treating thus the substrate surface before carrying out film formation, adhesive force can be improved to form a deposited film of good quality.

In the following, examples of the present invention are described by referring to the drawings.

First, FIG. 1 illustrates schematically the constitution of the device for forming a deposited film for practicing the method for formation of a deposited film for obtaining a deposited film having a thin film multi-layer structure according to the present invention.

The device shown in FIG. 1 is broadly classified into a main device (vacuum chamber), an evacuation system and a gas feeding system.

In the main device, a reaction space and a film forming space are provided.

101–108 are respectively bombs filled with the gases to be used during film formation and/or etching, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e are respectively valves, and 101f–108f are respectively pressure gauges indicating the pressures in the corresponding gas bombs.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be provided as opposed to the gas discharging outlet of the pipeline. The pipeline for gas introduction has a triplex pipe structure of concentric arrangement, having from the innerside a first gas introducing pipe 109 for introducing the gases from the gas bombs 101, 102, a second gas introducing pipe 110 for introducing the gases from the gas bombs 103–105, and a third gas introducing pipe 111 for introducing the gases from the gas bombs 106–108.

For gas evacuation to the reaction space of each gas introducing pipe, its position is designed so as to be arranged at a position further from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123–125, respectively.

The respective gas introducing pipes, the respective gas feeding pipe lines and the vacuum chamber 120 are evacuated to vacuum through the main vacuum valve 119 by means of a vacuum evacuating device not shown.

The substrate 118 is set at a suitable position with a desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film formed, the gas flow rates, the inner pressure in the vacuum chamber, etc., but it is preferably several mm to 20 cm, more preferably 5 mm to about 15 cm.

113 is a heater for heating the substrate which is provided in order to heat the substrate to an appropriate temperature during film formation, or to preheat the substrate 118 before film formation, and further to anneal the film after film formation.

The substrate heating heater 113 is supplied with power through a conductive wire 114 from a power source 115.

116 is a thermocouple for measuring the temperature of the substrate (Ts) and is electrically connected to the temperature display device 117.

By use of such a device for forming a deposited film, the methods for preparing photosensor, thin film transistor (hereinafter called TFT), solar battery and photoconductive member for electrophotography according to the present invention are described in detail.

EXAMPLE 1

Figure 2:
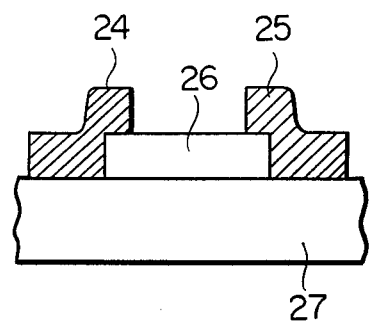
FIG. 2 is a schematic illustration of the constitution of a photosensor prepared according to the present invention.

FIG. 2 illustrates schematically the constitution of a photosensor prepared according to the present invention.

First, on a substrate supporting stand 112, a glass substrate (corning 7059) 27 was placed, the distance between the gas releasing outlet of the gas introducing pipe 11 and the substrate 27 was set at 3 cm, and the substrate temperature at 250° C., respectively.

Subsequently, $F_2$ gas filled in the bomb 106 was introduced at a flow rate of 2 sccm and He gas filled in the bomb 107 at a flow rate of 40 sccm through the gas introducing pipe 111 into the vacuum chamber 120.

During this operation, the inner pressure of the vacuum chamber 120 was made 800 mTorr by controlling the opening of the vacuum valve 119.

This state was maintained as such for 30 min tes, and the surface of the glass substrate 27 was subjected to etching.

Next, $SiH_4$ gas filled in the bomb 101 was introduced at a flow rate of 20 sccm through the gas introducing pipe 109 into the vacuum chamber 120.

By maintaining this state, a-Si:H:F film 26 was formed on the surface of the glass substrate 27. After patterning of the thus prepared a-Si:H:F film 26, Al electrodes 24 and 25 were formed by the vapor deposition method as shown in FIG. 2 to prepare a photosensor. The electron mobility of the a-Si:H:F film 26 obtained was found to be about 0.8 $cm^2/V$ sec, and the film thickness was 0.5 μm.

By forming an a-Si:H:F film 26 on the glass substrate 27 in the manner as described above, adhesive force was improved and also deposition was performed without contamination to give an a-Si:H:F film of good quality. As the result, a photosensor with excellent photoelectric converting efficiency and electrical characteristics was obtained.

EXAMPLE 2

Figure 3:
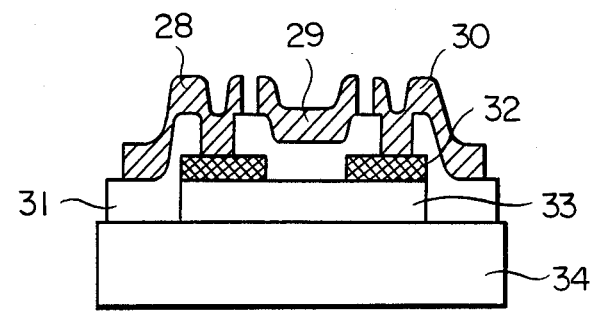
FIG. 3 is a schematic illustration of the constitution of a thin film transistor prepared according to the present invention.

FIG. 3 illustrates schematically the constitution of a TFT prepared according to the present invention.

First, on a substrate supporting stand 112, a substrate 34 was placed, the distance between the gas releasing outlet of the gas introducing pipe 111 and the substrate 34 was set at 3 cm, and the substrate temperature at 400° C., respectively.

Subsequently, $F_2$ gas filled in the bomb 106 was introduced at a flow rate of 2 sccm and He gas filled in the bomb 107 at a flow rate of 40 sccm through the gas introducing pipe 111 into the vacuum chamber 120.

During this operation, the pressure in the vacuum chamber 120 was made 800 mTorr by controlling the opening of the vacuum valve 119.

This state was maintained as such for 30 minutes, and the surface of the glass substrate 34 was subjected to etching.

Next, SiH$_4$ gas filled in the bomb 101 was introduced at a flow rate of 20 sccm through the gas introducing pipe 109 into the vacuum chamber 120.

By maintaining this state, a polycrystalline Si:H:F film 33 was formed on the glass substrate 34. After having thus formed the polycrystalline Si:H:F film 33 to a thickness of 0.6 μm, introduction of all the gases was stopped by stopping of the heating heater, and the vacuum chamber 120 was internally returned to atmospheric pressure by opening the vacuum valve 119. The substrate was then left to cool and taken out.

Subsequently, after patterning of the polycrystalline Si:H:F film 33, n+ layer 32 for obtaining ohmic contact was formed and further a gate insulating layer 31 of silicon nitride, etc., was formed to a thickness of 0.3 μm thereon. And, through the contact hole formed on the insulating layer 31 on the n+ layer 32, a source electrode 28 and a drain electrode 30 were formed, and a gate electrode 29 was formed opposed to the polycrystalline Si:H:F layer 33 through the insulating layer 31.

The TFT thus prepared by utilizing the present invention was found to exhibit excellent electrical characteristics with a good ON/OFF resistance ratio on account of having a semiconductor layer of good quality.

EXAMPLE 3

Figure 4:
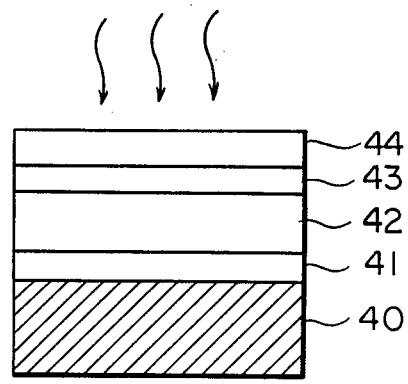
FIG. 4 is a schematic illustration of the constitution of a solar battery prepared according to the present invention.

FIG. 4 illustrates schematically the constitution of a solar battery prepared according to the present invention.

First, on the substrate supporting stand 112, the substrate 40 was placed, the distance between the gas releasing outlet of the gas introducing pipe 111 and the substrate 40 was set at 3 cm and a substrate temperature at 200° C., respectively.

Subsequently, F$_2$ gas filled in the bomb 106 was introduced at a flow rate of 2 sccm and He gas filled in the bomb 107 at a flow rate of 40 sccm through the gas introducing pipe 111 into the vacuum chamber 120.

During this operation, the pressure in the vacuum chamber 120 was made 800 mTorr by controlling the opening of the vacuum valve 119.

This state was maintained as such for 30 minutes, and the surface of the substrate 40 was subjected to etching.

Next, by use of SiH$_4$ gas as the gaseous starting material, PH$_3$ gas as the starting material for introduction of n-type impurity and F$_2$ gas as the gaseous halogenic oxidizing agent, a n-type a-Si:H:F:P semiconductor layer 41 was formed in the following manner.

First, SiH$_4$ gas in the bomb 101 was introduced at a flow rate of 20 sccm through the gas introducing pipe 109, PH$_3$/He gas (PH$_3$ concentration 5000 ppm) in the bomb 104 at a flow rate of 10 sccm through the gas introducing pipe 110, F$_2$ gas and He gas in the bombs 106 and 107 without change in the flow rate, respectively into the vacuum chamber 120, and the inner pressure was set at 0.8 Torr, to form a n-type a-Si:H:F:P semiconductor layer 41 with a thickness of about 500 Å on the substrate 40.

Next, by use of only SiH$_4$ gas as the gaseous starting material and F$_2$ gas as the gaseous halogenic oxidizing agent, an i-type a-Si:H:F semiconductor layer 42 was formed on the semiconductor layer 41 in the following manner.

That is, with the valves 104d and 104e on the PH$_3$/He gas feeding pipe 104a being closed. And the flow rates of SiH$_4$ gas, F$_2$ gas and He gas being unchanged as described above, the pressure in the vacuum chamber 120 was set at 0.8 Torr to form an i-type a-Si:H:F semiconductor layer 42 with a thickness of about 5000 Å.

Next, by use of SiH$_4$ gas and CH$_4$ gas as the gaseous starting material, and B$_2$H$_6$/He gas (B$_2$H$_6$ concentration 3000 ppm) as the starting material for introduction of p-type impurity, and F$_2$ gas as the gaseous halogenic oxidizing agent, a p-type a-SiC:H:F:B semiconductor layer 43 was formed on the semiconductor layer 42 in the following manner.

That is, CH$_4$ gas filled in the bomb 102 was introduced at 3 sccm through the gas introducing pipe 109 into the vacuum vessel 120, and B$_2$H$_6$ gas diluted to 3000 ppm with He gas filled in the bomb 103 (B$_2$H$_6$/He gas) at 10 sccm through the gas introducing pipe 110 into the vacuum vessel 120. With the flow rates of SiH$_4$ gas, F$_2$ gas and He gas not being changed, the pressure in the vacuum vessel 120 was set at 0.8 Torr and maintained as such for 4 minutes. As a result, a p-type a-SiC:H:F:B semiconductor layer 43 having a film thickness of about 300 Å was formed on the i-type a-Si:H:F semiconductor layer 42.

After having formed a photoelectric converting layer comprising the three layers on the substrate 40, introduction of all the gases was stopped, the heater was disengaged, and the vacuum vessel 120 was internally returned to atmospheric pressure by opening the vacuum valve 119. After the substrate was left to cool, the SUS substrate having the photoelectric converting layer formed thereon was taken out from the vacuum chamber 120. This was further placed in another vacuum vessel, and an SnO$_2$ film 44 with a thickness of 1000 Å was formed on the p-type semiconductor layer 43 to prepare a PIN-type solar battery. As the result of investigation of the solar battery thus obtained, it was found that the respective layers formed on the substrate were all uniform in film quality and film thickness, having excellent quality.

Next, when the solar battery was irradiated from the SnO$_2$ film 44 side with a light of 100 mW/cm$^2$ (AM-1), a conversion efficiency higher by about 1.3-fold as compared with the solar battery prepared according to the method of the prior art was obtained.

EXAMPLE 4

Figure 5:
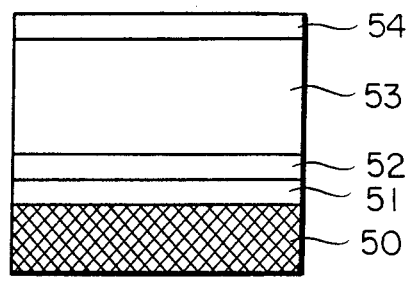
FIG. 5 is a schematic illustration of the constitution of a photoconductive member for electrophotography prepared according to the present invention.

FIG. 5 illustrates schematically the constitution of a photoconductive member for electrophotography prepared according to the present invention.

In FIG. 5, on the substrate 50 made of stainless steel, an amorphous layer 51 of a-Si:Ge:0:H:F:B, an amorphous layer 52 of p-type a-Si:0:H:F:B, an amorphous layer 53 of a-Si:H:F having photoconductivity and an amorphous layer 54 of a-Si:C:H:F which is the surface protective layer are formed.

First, on the substrate supporting stand 112, the stainless substrate 50 was placed, the distance between the gas releasing outlet of the gas introducing pipe 111 and the substrate 50 was set at 3 cm and the substrate temperature at 250° C.

Next, F$_2$ gas filled in the bomb 106 was introduced at a flow rate of 15 sccm and He gas filled in the bomb 107 at a flow rate of 50 sccm through the gas introducing pipe 111 into the vacuum chamber 120.

During this operation, the pressure in the vacuum chamber 120 was made 300 mTorr by controlling the opening of the vacuum valve 119. This state was maintained as such for 20 minutes, and the surface of the substrate was subjected to etching to effect washing and smoothing of the surface of the substrate 50.

Next, $O_2$ gas filled in the bomb 108 was introduced into the vacuum chamber 120 at a flow rate of 10 sccm through the gas introducing pipe 111, $SiH_4$ gas filled in the bomb 101 at a flow rate of 50 sccm, $GeH_4$ gas filled in the bomb 102 at a flow rate of 15 sccm through the gas introducing pipe 109 into the vacuum chamber 120, $B_2H_6$ gas diluted with $H_2$ to 1% filled in the bomb 103 (hereinafter represented as "$B_2H_6/H_2$") at a flow rate of 10 sccm into the vacuum chamber 120, and the pressure in the chamber 120 was maintained at 300 mTorr without change of the flow rates of $F_2$ gas and He gas.

Under this state being maintained as such, an amorphous layer 51 comprising a-Si:Ge:O:H:F:B with a film thickness of 1 μm was formed on the substrate 50.

Subsequently, under the film forming conditions shown in Table 1, the amorphous layer 52 comprising a-Si:O:H:F:B, the amorphous layer 53 comprising a-Si:H:F and the amorphous layer 54 comprising a-Si:C:H:F were successively formed to prepare the photoconductive member for electrophotography. In this process, $C_2H_4$ gas was introduced through the gas introducing pipe 110 into the vacuum chamber 120 from the bomb 104.

When image characteristic evaluation was conducted for the photoconductive member for electrophotography as prepared above, potential irregularity was found to be ±5 V, the number of image defect was initially 9, 11 after successive copying of 50000 sheets, 15 after successive copying of 150000 sheets. The results indicated that the photoconductive member for electrophotography as obtained had satisfactory performance capable standing practical application.

ing outlets 607a, 607b, 607c of the respective deposition spaces each have a large number of gas releasing holes scattered radially.

Also, heaters 605a, 605b, 605c are positioned opposite the gas releasing outlets of these gas introducing pipes to heat the substrate 608 to a desired temperature. Thus, a PIN-type laminated structure can be formed continuously without entrainment of impurity, and yet a photoelectric converting layer of high quality and high photoelectric converting efficiency can be obtained because no plasma reaction is utilized.

Figure 6:
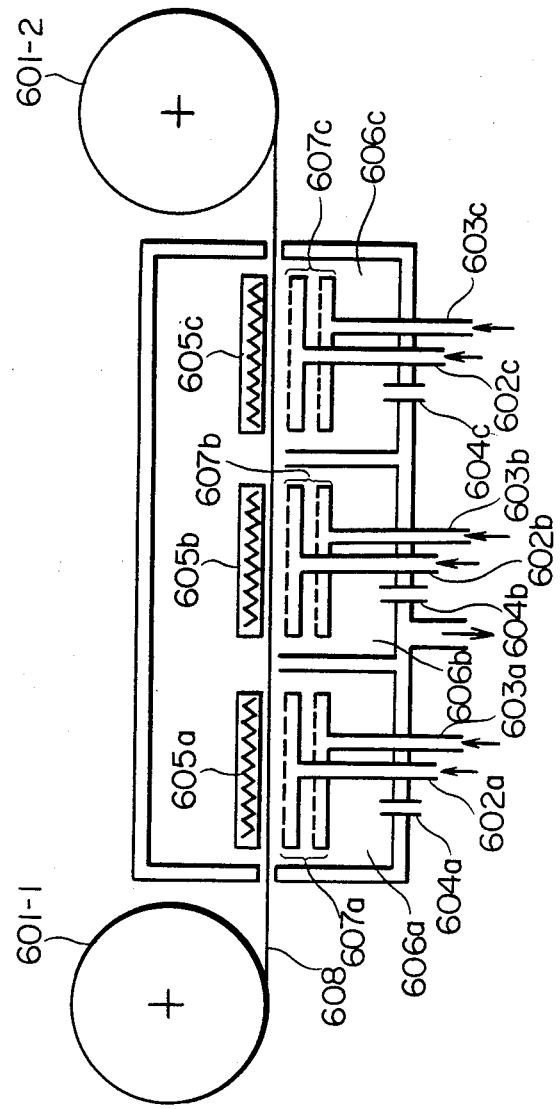
FIG. 6 is a schematic illustration of the constitution of a second example of the device for forming a deposited film according to the present invention.

The method for preparing a photovoltaic device by use of the device shown in FIG. 6 is described in detail below.

EXAMPLE 5

Figure 7:
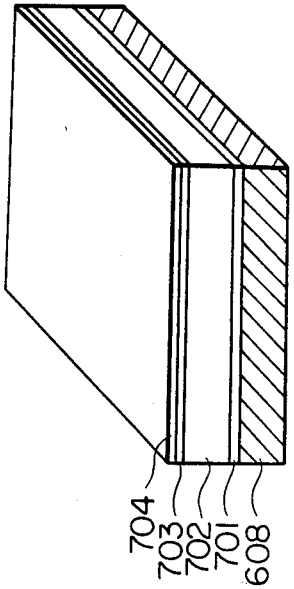
FIG. 7 is a schematic perspective view of a photovoltaic device prepared according to the present invention.

First, in the deposition space 606a, gaseous starting materials (20 sccm of $PH_3$ gas diluted with He to 3000 ppm and 30 sccm of $SiH_4$ gas) are introduced through the gas introducing pipe 603a and a gaseous halogenic oxidizing agent (12 sccm of $F_2$ gas) through the gas introducing pipe 602a respectively, to deposit a n-type semiconductor layer 701 to a thickness of 400 Å on a sheet substrate 608 made of stainless steel (FIG. 7).

Next, in the deposition space 606b, $SiH_4$ gas was introduced at 45 sccm through the gas introducing pipe 603b and $F_2$ gas at 15 sccm through the gas introducing pipe 602b, respectively, to deposit an i-type semiconductor layer 702 with a thickness of 6000 Å on the n-type semiconductor layer 701.

Next, in the deposition space 606c, $B_2H_6$ gas diluted with He to 3000 ppm was introduced at 22 sccm, $SiH_4$ gas at 25 sccm and $CH_4$ gas at 4 sccm through the gas introducing pipe 603c and $F_2$ gas at 12 sccm through the gas introducing pipe 602c, respectively, to deposit a p-type semiconductor layer 703 with a thickness of 600 Å on the i-type semiconductor layer 702.

The temperature of the substrate 608 during deposition of the respective semiconductor layers was maintained at 250° C. Subsequently, a $SnO_2$ layer 704 with a

TABLE 1

| Deposited layer | a-Si:O:H:F:B amorphous layer 52 | | a-Si:H:F amorphous layer 53 | | a-Si:C:H:F amorphous layer 54 | |
|---|---|---|---|---|---|---|
| Kinds and flow rates of starting materials and halogenic oxidizing agent | $SiH_4$ | 50 sccm | $SiH_4$ | 150 sccm | $SiH_4$ | 10 sccm |
| | $B_2H_6/H_2$(1%) | 10 sccm | $F_2$ | 70 sccm | $C_2H_4$ | 300 sccm |
| | $F_2$ | 15 sccm | He | 250 sccm | $F_2$ | 200 sccm |
| | $O_2$ | 10 sccm | | | He | 20 sccm |
| | He | 50 sccm | | | | |
| Film thickness (μm) | 3 | | 18 | | 0.1 | |
| Inner Pressure (Torr) | 0.3 | | 0.9 | | 0.4 | |

Next, another example of the present invention in which a PIN-type photovoltaic device is formed is described below.

First, FIG. 6 illustrates schematically the constitution of a second example of the device for forming a deposited film used for embodying the present invention. In FIG. 6, the substrate 608 drawn out from the delivery roller 601-1 passes through the deposition spaces 606a, 606b and 606c for depositing respectively the p-type layer, i-type layer and n-type layer to form a PIN structure thereon and wound up by the wind-up roller 601-2. Into the deposition spaces 606a, 606b, 606c are introduced through the gas introducing pipes 602a, 602b, 602c the gaseous halogenic oxidizing agent, and through the gas introducing pipes 603a, 603b, 603c the gaseous starting material, respectively. The gas releasthickness of 500 Å was formed on the p-type semiconductor layer 703 according to the vacuum deposition method.

The photovoltaic device shaped in a roll thus prepare was cut out into a square shape of about 12 cm×12 cm. FIG. 7 shows its perspective view.

Next, the steps of separating the square-shaped device thus cut out with a desired pattern are to be described.

Figure 8A:
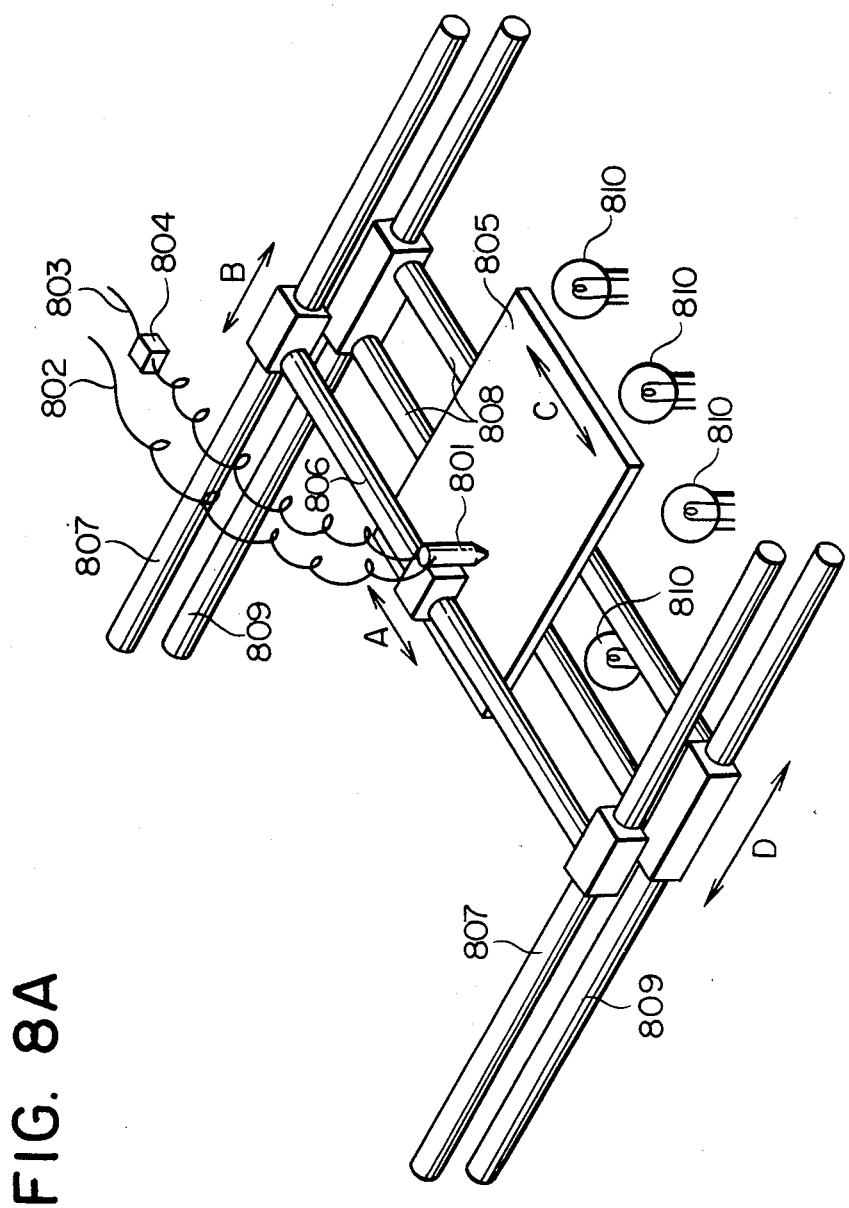
FIG. 8A is a schematic perspective view showing the main part of a patterning device for embodying the present invention and FIG. 8B is a schematic sectional view of the gas discharging pipe of the patterning device shown in FIG. 8A.
Figure 8B:
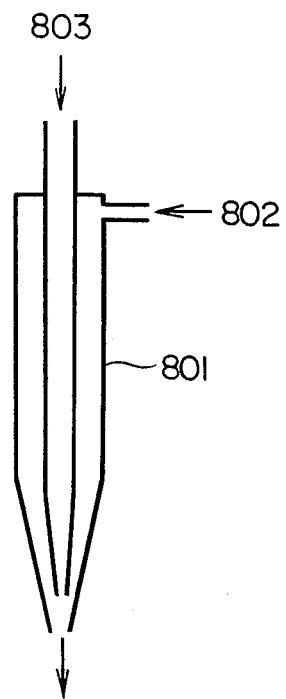

First, FIG. 8A is a perspective view showing the main part of the patterning device and FIG. 8B is a schematic sectional view of its gas discharging pipe.

Into the gas discharging pipe 801 having a multi-tubular structure as shown in FIG. 8B is introduced a gaseous halogenic oxidizing agent through the gas introducing inlet 802 and a gaseous starting material through the electromagnetic valve 804 from the gas introducing inlet 803. And, the gas mixture of the gaseous starting material and the halogenic oxidizing agent or the halogenic oxidizing agent alone discharged from a nozzle-shaped gas discharging outlet of the gas discharging pipe 801 contacts the limited region of the substrate fixed on the stage 805 to effect a partial etching of the deposited film already formed.

The gas discharging pipe 801 is movable in the direction of the arrowhead A and/or in the direction of the arrowhead B by the main scanning rail 806 and sub-scanning rail 807, and the stage 805 is movable in the direction of the arrowhead C and/or in the direction of the arrowhead D by the main scanning rail 808 and the sub-scanning rail 809. Accordingly, the gas discharging pipe 801 can be moved to any desired position of the substrate on the stage 805, whereby formation of a deposited film with a desired pattern or etching with a desired pattern can be effected.

Also, the substrate on the stage 805 is heated by the halogen lamp 810.

Figure 9:
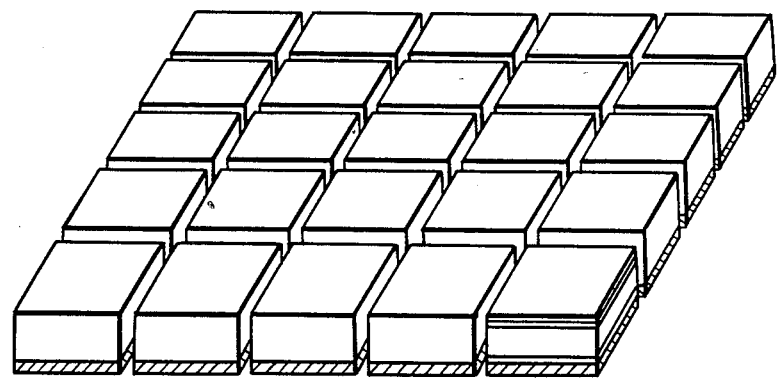
FIG. 9 is a schematic perspective view of a photovoltaic device separated according to the present invention.

By use of such a device, separation of the photovoltaic device shown in FIG. 7 was performed as follows. First, the photovoltaic device was fixed on the stage 805 and, with the electromagnetic valve 804 being closed, feeding of the gaseous starting materials such as $SiH_4$, etc., was stopped, and $F_2$ gas diluted to 20% was fed at 80 sccm to the gas discharging pipe 801 to maintain the inner pressure at 1 Torr. And, the gas discharging pipe 801 was moved relative to the stage 805 as described above to separate the deposited film, etc., by partial etching of the photovoltaic device independently. FIG. 9 is a perspective view of the photovoltaic device showing the state in which the photovoltaic device is completely separated independently into a shape of lattice by scanning the gas discharging pipe 801 in shape of a lattice.

Each photovoltaic device thus prepared exhibited photoelectric converting efficiency which is sufficiently practical.

In this example, the deposited film was formed by the device for forming a deposited film shown in FIG. 6 and separated by the device shown in FIGS. 8A and 8B. However, the device shown in FIGS. 8A and 8B can also be used for formation of a deposited film by merely changing the mixing ratio of the used gases as already described. Therefore, with the substrate being fixed on the stage 805, gaseous starting material and halogenic oxidizing agent may be released from the gas discharging pipe 801 to form a deposited film with a desired pattern, and thereafter the deposited film may be separated with the flow rate of the gaseous starting material being reduced or feeding thereof being stopped.

EXAMPLE 6

Similarly as in Example 5, preparation of a photovoltaic device is to be described.

The constitution of the photovoltaic device to be prepared is similar to that shown in FIG. 7, but the pre-treatment as described below was applied on a batch substrate made of stainless steel. That is, by means of the device shown in FIG. 10, the batch substrate made of stainless steel was subjected to surface treatment by use of fluorine gas.

Figure 10:
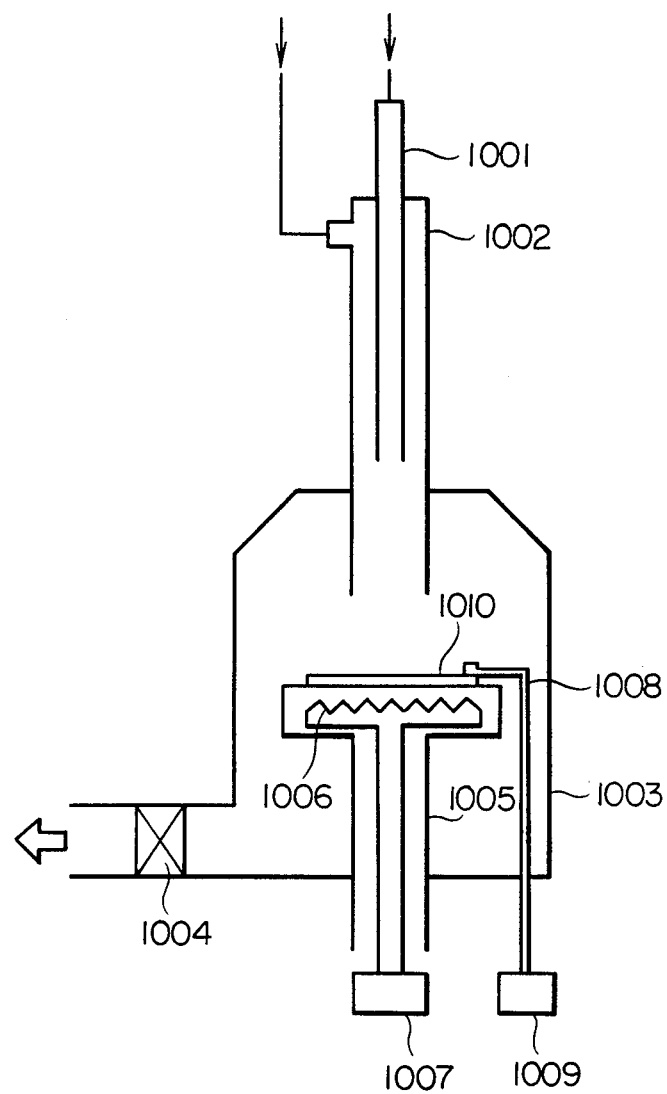
FIG. 10 is a schematic sectional view of a device for surface treatment used in Examples.

The device shown in FIG. 10 is now described. In FIG. 10, 1001 is a gaseous starting material introducing pipe, 1002 a gaseous halogenic oxidizing agent introducing pipe, 1003 a chamber, 1004 a valve for vacuum evacuation, 1005 a substrate supporting stand, 1006 a heater for heating substrate, 1007 a heater power source for heating substrate, 1008 a thermocouple for monitoring substrate temperature, 1009 a substrate temperature monitor and 1010 a batch substrate made of stainless steel.

In this Example, the gaseous starting material introducing pipe 1001 was not used, but fluorine gas diluted with He to 5000 ppm was introduced at 20 sccm through the gaseous halogenic oxidizing agent introducing pipe 1002, and the pressure in the chamber 1003 was set at 100 mTorr by controlling the vacuum evacuation valve 1004. The substrate temperature was constantly 250° C. By leaving this state to stand for 5 minutes, the surface of the batch substrate 1010 made of stainless steel was etched. This was done for the purpose of bringing about the texture effect, namely improvement of efficiency of light absorption to the photovoltaic device by washing and roughening the surface of a substrate 1010.

Figure 11A:
FIG. 11A is a schematic sectional view illustrating the surface state of a substrate and FIG. 11B is a schematic sectional view of a photovoltaic device prepared according to the present invention.

FIG. 11A is a schematic sectional view of the substrate 1010 of which the surface has been thus subjected to etching.

Figure 11B:
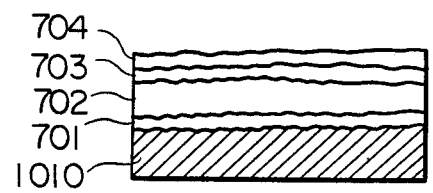

After such pre-treatment, the same gas species as shown in Example 5 were introduced through the gas introducing pipes 1001 and 1002 to laminate a n-type amorphous silicon layer 701 with a thickness of 500 Å, an i-type amorphous silicon layer 702 with a thickness of 5000 Å and a p-type amorphous silicon layer 703 with a thickness of 500 Å on the substrate 1010, made further a $SnO_2$ layer 704 as the transparent electrode to a thickness of about 300 Å. FIG. 11B is a schematic sectional view of the photovoltaic device.

The batch photovoltaic device was set at the device shown in FIGS. 8A and 8B similarly as in Example 5, and by repeating the same operation as in Example 5, it could be separated into the shape of a lattice as shown in FIG. 9. One of the photovoltaic device thus separated was taken out and irradiated with the use of AM-1 as the light source. As the result, it was found to be a photovoltaic device which can be practically used.

EXAMPLE 7

By use of the device for forming a deposited film shown in FIG. 1, a photosensor was prepared according to the present invention as described below.

The constitution of the photosensor prepared according to this Example is schematically illustrated in FIG. 2.

First, a glass substrate 27 was placed on the substrate supporting stand 112, and the distance between the gas releasing outlet of the gas introducing pipe 111 and the substrate 27 was set at 3.4 cm and the substrate temperature at 250° C., respectively. Subsequently, $F_2$ gas filled in the bomb 106 was introduced at a flow rate of 3 sccm and He gas filled in the bomb 107 at a flow rate of 40 sccm through the gas introducing pipe 111 into the vacuum chamber 120. During this operation, the pressure in the vacuum chamber 120 was made 800 mTorr by controlling the opening of the vacuum valve 119.

This state was maintained as such for 30 minutes to effect etching of the surface of the glass substrate 27.

Next, $SiH_4$ gas filled in the bomb 101 was introduced at a flow rate of 30 sccm through the gas introducing pipe 109 into the vacuum chamber 120.

When the gas was flowed under this state for 45 minutes, an a-Si:H:F film 26 was deposited on the surface of the glass substrate 27. The a-Si:H:F film 26 obtained was fixed on the stage 805 shown in FIG. 8A with the portion having uniform thickness as the center. And, similarly as in Example 5, after the a-Si:H:F film 26 was formed by separation into a desired shape, Al electrodes 24 and 25 were formed by vacuum vapor deposition as shown in FIG. 2 to prepare a photosensor. When the photosensor was irradiated
with a monochromatic light with wavelengths of 6328 Å and an emission intensity of 0.5 mW using He-Ne laser as the light source, it was confirmed to have the characteristics of a dark electroconductivity of $2.0 \times 10^{-11} \Omega^{-1} cm^{-1}$ and a photoconductivity of $3.5 \times 10^{-6} \Omega^{-1} cm^{-1}$.

EXAMPLE 8

By use of the device for forming a deposited film shown in FIG. 1, thin film transistor (TFT) was prepared according to the present invention. The constitution of the TFT is schimatically illustrated in FIG. 3.

First, a glass substrate 34 was placed on a substrate supporting stand 112, and the distance between the gas releasing outlet of the gas introducing pipe 111 and the substrate 34 was set at 3 cm and the substrate temperature at 420° C., respectively. Subsequently, $F_2$ gas filled in the bomb 106 was introduced at a flow rate of 3 sccm and He gas filled in the bomb 107 at a flow rate of 40 sccm through the gas introducing pipe 111 into the vacuum chamber 120. During this operation, the pressure in the vacuum chamber 120 was made 800 mTorr by controlling the opening of the vacuum valve 119.

This state was maintained as such for 20 minutes to effect etching of the surface of the glass substrate 34.

Next, SiH$_4$ gas filled in the bomb 101 was introduced at a flow rate of 20 sccm through the gas introducing pipe 109 into the vacuum chamber 120.

When the gas was flowed under this state for one hour, a polycrystalline Si:H:F film 33 was deposited on the glass substrate 34.

The polycrystalline Si:H:F film 33 was fixed on the stage 805 shown in FIG. 8A with the portion having uniform film thickness as the center, and separated into a desired pattern similarly as in Example 5.

A n$^+$ layer 32 for obtaining ohmic contact was formed and a gate insulating layer 31 such as of silicon nitride was formed to a thickness of 0.3 μm thereon. And, through the contact hole formed at the insulating layer 31 on the n$^+$ layer 32, a source electrode 28 and drain electrode 30 were formed, and a gate electrode 29 was formed as opposed to the polycrystalline Si:H:F film 33 through the insulating layer 31. The TFT thus prepared by utilizing the present invention had semiconductor layer of good quality and therefore exhibited excellent electrical characteristics with good ON/OFF resistance ratio.

EXAMPLE 9

The constitution of the photoconductive member for electrophotography prepared according to this Example is schematically illustrated in FIG. 5. The member was prepared by use of the device shown in FIG. 1.

In FIG. 5, on the substrate 50 made of stainless steel, there were formed an amorphous layer of a-Si:-Ge:O:H:F:B 51, an amorphous layer of p-type a-Si:O:H:F:B 52, an amorphous layer of a-Si:H:F having photoconductivity 53 and an amorphous layer of a-Si:C:H:F 54 which is a surface protective layer in the manner described below.

First, a stainless substrate 50 was placed on the substrate supporting stand 112, and the distance between the gas releasing outlet of the gas introducing pipe 111 and the substrate 50 was set at 3 cm and the substrate temperature at 250° C.

Next, F$_2$ gas filled in the bomb 106 was introduced at a flow rate of 30 sccm and He gas filled in the bomb 107 at a flow rate of 50 sccm through the gas introducing pipe 111 into the vacuum chamber 120. During this operation, the pressure in the vacuum chamber 120 was made 300 mTorr by controlling the opening of the vacuum valve 119. This state was maintained as such for 15 minutes to effect etching of the surface of the substrate 50, thereby washing and smoothening the surface of the substrate 50.

Next, O$_2$ gas filled in the bomb 108 was introduced at a flow rate of 10 sccm through the gas introducing pipe 111 into the vacuum chamber 120, and SiH$_4$ gas filled in the bomb 101 at a flow rate of 50 sccm, GeH$_4$ gas filled in the bomb 102 at a flow rate of 15 sccm through the gas introducing pipe 109 into the vacuum chamber 120, B$_2$H$_6$ gas diluted with H$_2$ to 1% filled in the bomb 103 (B$_2$H$_6$/H$_2$) at a flow rate of 10 sccm into the vacuum chamber 120, and the pressure in the vacuum chamber 120 was maintained at 300 mTorr without changing the flow rates of F$_2$ gas and He gas.

This state was maintained as such for 10 minutes to form an amorphous layer 51 comprising a-Si:-Ge:P:H:F:B with a film thickness of 1 μm on the substrate 50.

Following subsequently the film forming condition shown in Table 2, an amorphous layer 52 with a thickness of 0.5 μm comprising the above a-Si:O:H:F:B, an amorphous layer 53 with a thickness of 18 μm comprising a-Si:H:F and an amorphous layer 54 with a thickness of 0.4 μm comprising a-Si:C:H:F were formed successively to prepare a photoconductive member for electrophotography. C$_2$H$_4$ gas was introduced through the gas introducing pipe 110 into the vacuum chamber 120 by use of the gas filled in the bomb 104.

The photoconductive member thus prepared was fixed on the stage 805 shown in FIG. 8A, and the ends were removed to complete the device.

TABLE 2

| Deposited layer | a-Si:O:F:B amorphous layer 52 | | a-Si:H:F amorphous layer 53 | | a-Si:C:H:F amorphous layer 54 | |
|---|---|---|---|---|---|---|
| Kinds and flow rates of starting materials and halogenic oxidizing agent | SiH$_4$ | 40 sccm | SiH$_4$ | 100 sccm | SiH$_4$ | 40 sccm |
| | B$_2$H$_6$/H$_2$(%) | 5 sccm | F$_2$ | 35 sccm | C$_2$H$_4$ | 200 sccm |
| | F$_2$ | 10 sccm | He | 150 sccm | F$_2$ | 4 sccm |
| | O$_2$ | 10 sccm | | | He | 15 sccm |
| | He | 30 sccm | | | | |
| Deposition time(min.) | 10 | | 60 | | 4 | |
| Film thickness (μm) | 0.5 | | 20 | | 0.4 | |
| Deposition speed | 8.3 | | 55 | | 16.7 | |

TABLE 2-continued

| Deposited layer | a-Si:O:F:B amorphous layer 52 | a-Si:H:F amorphous layer 53 | a-Si:C:H:F amorphous layer 54 |
| --- | --- | --- | --- |
| (Å sec) | | | |
| Inner pressure (Torr) | 0.3 | 0.9 | 0.4 |

When image characteristics were evaluated for the photoconductive member for electrophotography obtained as described above, the potential irregularity was found to be ±5 V, the number of image defects were initially 9, 11 after successive copying of 50000 sheets, 15 after successive copying of 150000 sheets, thus having satisfactory performances which can stand practical application.

EXAMPLE 10

The constitution of the photosensor prepared according to this Example by use of the device shown in FIG. 1 is schematically illustrated in FIG. 2.

First, a glass substrate 27 was placed on a substrate supporting stand 112, and the distance between the gas releasing outlet of the gas introducing pipe 111 and the substrate 27 was set at 3 cm and the substrate temperature at 250° C., respectively.

The SiH$_4$ gas filled in the bomb 101 was introduced at a flow rate of 20 sccm through the gas introducing pipe 109 into the vacuum chamber 120. At the same time, F$_2$ gas filled in the bomb 106 was introduced at a flow rate of 2 sccm and He gas filled in the bomb 107 at a flow rate of 40 sccm through the gas introducing pipe 111 into the vacuum chamber 120.

During this operation, the pressure in the vacuum chamber 120 was made 800 mTorr by controlling the opening of the vacuum valve 119. When gases were flowed under this state for 1 hour, an a-Si:H:F film 26 was deposited on the surface of the glass substrate 27.

Next, with the valve 101d on the SiH$_4$ gas feeding pipe 101a being closed, the pressure in the vacuum vessel 120 was set at 0.8 Torr without changing the flow rate of F$_2$ gas and He gas and maintained as such for about 30 seconds. As the result, the a-Si:H:F film 26 already formed was etched at its surface, whereby the film thickness became 0.4 μm. The film thickness was found to be uniform over the entire surface of the film formed. On the a-Si:H:F film 26 subjected to the etching treatment, Al electrodes 24 and 25 were formed according to the vapor deposition method as shown in FIG. 2 to prepare a photosensor. The photosensor exhibited good light receiving characteristics and electrical characteristics.

EXAMPLE 11

The constitution of the TFT prepared according to this Example by use of the device shown in FIG. 1 is schematically illustrated in FIG. 3.

First, a glass substrate 34 was placed on a substrate supporting stand 112, and the distance between the gas releasing outlet of the gas introducing pipe 111 and the substrate 34 was set at 3 cm and the substrate temperature at 400° C., respectively.

The SiH$_4$ gas filled in the bomb 101 was introduced at a flow rate of 20 sccm through the gas introducing pipe 109 into the vacuum chamber 120. At the same time, F$_2$ gas filled in the bomb 106 was introduced at a flow rate of 2 sccm and He gas filled in the bomb 107 at a flow rate of 40 sccm through the gas introducing pipe 111 into the vacuum chamber 120.

During this operation, the pressure in the vacuum chamber 120 was made 800 mTorr by controlling the opening of the vacuum valve 119. When the gases were flowed under this state for 1 hour, a polycrystalline Si:H:F film 33 was deposited on the surface of the above glass substrate 34.

Next, with the valve 101d on the SiH$_4$ gas feeding pipe 101a being closed, the pressure in the vacuum vessel 120 was set at 0.9 Torr without changing the flow rates of F$_2$ gas and He gas and maintained as such for about 10 seconds. As the result, the polycrystalline Si:H:F film 33 already formed was etched at its surface, whereby the average film thickness became 0.6 μm.

Figures 12A, 12B:
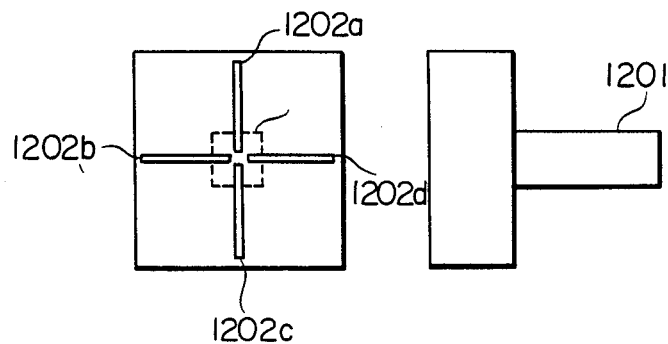
FIGS. 12A and 12B are schematic illustration of a gas releasing portion used for embodying the present invention.

Next, introduction of F$_2$ gas and He gas was stopped and a gas releasing portion as shown in FIGS. 12A and 12B was mounted at the tip end of the gas introducing pipe 111.

FIG. 12A shows a plan view and FIG. 12B shows side view of the gas releasing portion. Such a gas releasing portion is coupled to the tip end of the gas introducing pipe 111 at the coupling portion 1201, and the gas flowed through the gas introducing pipe 111 is released through the gas releasing slots 1202a–1202d.

Figure 13:
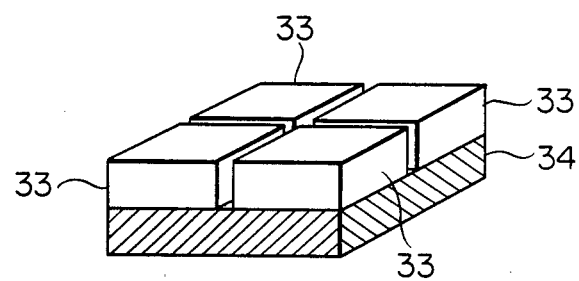
FIG. 13 is a schematic perspective view of a deposited film separated according to the present invention.

The F$_2$ gas filled in the bomb 106 was introduced at a flow rate of 5 sccm and the He gas filled in the bomb 107 at a flow rate of 40 sccm through the gas introducing pipe 111 from the gas releasing slots 1202a–1202d into the vacuum chamber 120. During this operation, the pressure in the vacuum chamber 120 was controlled to be maintained at 0.9 Torr. When this state was maintained for 15 seconds, the polycrystalline Si:H:F film 33 formed on the glass substrate 34 was etched to be separated into 4 portions as shown in FIG. 13.

After thus forming on the surface of the glass substrate 34 the polycrystalline Si:H:F film 33 subjected to the etching treatment at the prescribed portion on its surface and divided into 4 portions, introduction of all the gases was stopped, with the heating heater being also stopped, and the vacuum valve 119 was opened to return the vacuum chamber internally to atmospheric pressure. And, after the substrate was left to cool, it was taken out.

Subsequently, a n+ layer 32 for obtaining ohmic contact was formed, and further a gate insulating layer 31 of silicon nitride, etc., was formed to a thickness of 0.3 μm. And, through the contact hole formed at the insulating layer 31 on the n+ layer 32, a source electrode 28 and a drain electrode 30 were formed, and a gate electrode 29 was formed so as to be opposed through the insulating layer 31 to the polycrystalline Si:H:F layer 33.

The TFT thus prepared by utilizing the present invention exhibited excellent electrical characteristics with good ON/OFF resistance ratio.

EXAMPLE 12

The constitution of the solar battery prepared according to this Example by use of the device shown in FIG. 1 is schematically illustrated in FIG. 4.

First, a stainless steel substrate 40 was placed on the substrate supporting stand 112, and the distance between the gas releasing outlet of the gas introducing pipe 111 and the substrate 40 was set at 3 cm and the substrate temperature 200° C., respectively.

Subsequently, $F_2$ gas filled in the bomb 106 was introduced at a flow rate of 5 sccm and He gas filled in the bomb 107 at a flow rate of 40 sccm through the gas introducing pipe 111 into the vacuum chamber 120.

During this operation, the pressure in the vacuum chamber 120 was made 800 mTorr by controlling the opening of the vacuum valve 119.

This state was maintained for 30 seconds to roughen the surface of the substrate 40 by etching.

Next, by using $SiH_4$ gas as the gaseous starting material, $PH_3$ gas as the starting material for introduction of n-type impurity and $F_2$ gas as the gaseous halogenic oxidizing agent, a n-type a-Si:H:F:P semiconductor layer 41 was formed as described below.

First, $SiH_4$ gas in the bomb 101 was introduced at a flow rate of 30 sccm through the gas introducing pipe 109, $PH_3$/He gas ($PH_3$ concentration 5000 ppm) in the bomb 104 at a flow rate of 10 sccm through the gas introducing pipe 110, $F_2$ gas in the bomb 106 at a flow rate of 2 sccm and He gas in the bomb 107 at a flow rate of 40 sccm through the gas introducing pipe 111 into the vacuum chamber 120, respectively. And, the pressure in the vacuum chamber 120 was set at 0.8 Torr and maintained as such for 6 minutes to form a n-type a-Si:H:F:P semiconductor layer 41 on the substrate 40.

Next, introduction of all the gases except for He gas and $F_2$ gas into the vacuum chamber 120 was stopped, and this state was maintained as such for 10 seconds. As the result, the surface of the n-type a-Si:H:F:P semiconductor layer 41 was etched, whereby the average film thickness became 500 Å and also the surface was roughened.

Next, by using only $SiH_4$ gas as the gaseous starting material and $F_2$ gas as the gaseous halogenic oxidizing agent, an i-type a-Si:H:F semiconductor layer 42 was formed on the semiconductor layer 41 as described below.

That is, with the valve 104d on the $PH_3$/He gas feeding pipe 104a being closed, $SiH_4$ gas was introduced at a flow rate of 30 sccm through the gas introducing pipe 109 into the vacuum chamber 120, and the pressure in the vacuum chamber 120 was set at 800 mTorr without changing the flow rates of $F_2$ gas and He gas and maintained as such for 1 hour. As the result, on the n-type a-Si:H:F:P semiconductor layer 41 already formed, an i-type a-Si:H:F semiconductor layer 42 was formed. Next, with the valve 101d on the $SiH_4$ gas feeding pipe 101a being closed, the pressure in the vacuum chamber 120 was set at 1.0 Torr without changing the flow rates of $F_2$ gas and He gas and maintained as such for 10 seconds. As the result, the surface of the above i-type a-Si:H:F semiconductor layer 42 was etched, whereby the average film thickness became 5000 Å and also the surface was roughened.

Next, by using $SiH_4$ gas and $CH_4$ gas as the gaseous starting materials and $B_2H_6$/He gas ($B_2H_6$ concentration 3000 ppm) as the starting material for introduction of p-type impurity and $F_2$ gas as the gaseous halogenic oxidizing agent, a p-type a-SiC:H:F:B semiconductor layer 43 was formed on the semiconductor layer 42 as described below.

That is, $SiH_4$ gas was introduced at a flow rate of 30 sccm and CH gas filled in the bomb 102 at a flow rate of 3 sccm through the gas introducing pipe 109 into the vacuum chamber 120, and $B_2H_6$ gas diluted with He gas to 3000 ppm filled in the bomb 103 ("$B_2H_6$/He gas") at a flow rate of 10 sccm through the gas introducing pipe 110 into the vacuum chamber 120.

Without changing the flow rates of SiH gas, $F_2$ gas and He gas, the pressure in the vacuum vessel 120 was set at 0.8 Torr and maintained as such for 4 minutes. As the result, a p-type a-SiC:H:F:B semiconductor layer 43 was formed on the i-type a-Si:H:F semiconductor layer 42.

Next, with $F_2$ gas and He gas being flowed as such, introduction of other gases into the vacuum chamber 120 was stopped, and the pressure in the vacuum chamber 120 was set at 0.9 Torr and maintained as such for 10 seconds. As the result, the surface of the p-type a-SiC:H:F:B semiconductor layer 43 was etched, whereby the average film thickness became 300 Å and also the surface was roughened.

After a photoelectric converting layer comprising the three layers was thus formed on the substrate 40, introduction of all the gases was discontinued, with the heating heater being also stopped, and the vacuum valve 119 was opened to return the vacuum vessel 120 internally to atmospheric pressure. After the substrate was left to cool, the SUS substrate having the photoelectric converting layer formed thereon was taken out from the vacuum chamber 120. This was further placed in another vacuum vessel, and a $SnO_2$ film 44 with a thickness of 1000 Å was formed according to the thermal CVD method on the p-type semiconductor layer 43 to prepare a pin-type solar battery.

When the solar battery thus obtained was examined, it was consequently found that all of the respective layers formed on the substrate were uniform in both film quality and film thickness, having excellent quality.

Next, when the solar battery was irradiated with light (AM-1) of 100 mW/cm$^2$ from the $SnO_2$ film 44 side, a conversion efficiency higher by about 1.25-fold as compared with the solar battery prepared according to the method of the prior art was obtained. The reason for such improvement of conversion efficiency may be considered to be due to the light containment effect by roughening of the surface of the three-layer semiconductor layer by the etching treatment and improvement of adhesion between the respective semiconductor layers, etc.

Also, by use of the gas releasing portion shown in FIGS. 12A and 12B, a plural number of solar batteries can be also formed by separating the three layer semiconductor layer.

EXAMPLE 13

Figure 14:
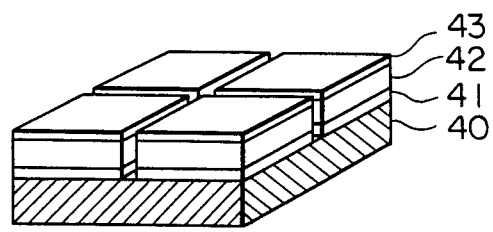
FIG. 14 is a schematic perspective view of a solar battery separated according to the present invention.

According to the same method as shown in Example 12, after formation of the n-type semiconductor layer 41, the i-type semiconductor layer 42 and the p-type semiconductor layer 43 on the substrate 40, a gas releasing portion schematically shown in FIGS. 12A and 12B was mounted on the tip end of the gas introducing pipe 111. The gas releasing portion was coupled to the tip end portion of the gas introducing pipe 111 at the coupling portion 1201, and the gas flowed through the gas introducing pipe 111 was released from the gas releasing slots 1202a–1202d. Thus, F$_2$ gas filled in the bomb 106 was introduced at a flow rate of 5 sccm and He gas filled in the bomb 107 at a flow rate of 30 sccm through the gas introducing pipe 111 from the gas releasing slots 1202a–1202d into the vacuum chamber 120. During this operation, the pressure in the vacuum chamber 120 was controlled to be maintained at 0.9 Torr. When this state was maintained as such for 20 seconds, the n-type, i-type and p-type semiconductor layers 41, 42, 43 on the substrate 40 were etched as shown in FIG. 14 to be separated into four islands.

What is claimed is:

1. A method for forming a deposited film on a substrate in a film forming space by introducing into a reaction space a gaseous starting material for formation of a deposited film and a gaseous halogenic oxidizing agent selected from the group consisting of F$_2$, Cl$_2$, Br$_2$ and I$_2$, said gaseous halogenic oxidizing agent having the property of oxidation action on said starting material to effect chemical contact therebetween to thereby form a plural number of precursors including precursors in an excited state, said film forming space positioned adjacent and in communication with said reaction space and said deposited film including at least one of these precursors as a constituent element thereof, said method comprising:

forming in said reaction space a first mixture of said gaseous starting material and said gaseous halogenic oxidizing agent in an amount ratio relative to each other such that said first mixture is capable of effecting an etching action on said substrate;

introducing said first mixture into said film forming space to effect said etching action on said substrate and form an etched substrate;

increasing the amount of said gaseous starting material relative to the amount of said gaseous halogenic oxidizing agent to form a second mixture in said reaction space capable of effecting film formation on said etched substrate; and introducing said second mixture into said film forming space to effect said film formation on said etched substrate.

2. The method according to claim 1, wherein said gaseous starting material is a chain silane compound.

3. The method according to claim 3, wherein the chain silane compound is a straight chain compound.

4. The method according to claim 3, wherein the straight chain silane compound is represented by the general formula Si$_n$H$_{2n+2}$ (n is an integer of 1–8).

5. The method according to claim 2, wherein the chain silane compound is a branched chain silane compound.

6. The method according to claim 1, wherein said gaseous starting material is a silane compound having a cyclic structure of silicon atoms.

7. The method according to claim 1, wherein said gaseous starting material is a chain germane compound.

8. The method according to claim 7, wherein the chain germane compound is represented by the general formula Ge$_m$H$_{2m+2}$ (m is an integer of 1–5).

9. The method according to claim 1, wherein said gaseous starting material is a tetrahedral compound.

10. The method according to claim 1, wherein the substrate is positioned as opposed to the direction in which said gaseous starting material and said gaseous halogenic oxidizing agent are introduced into said reaction space.

11. A method for forming a deposited film on a substrate in a film forming space by introducing into a reaction space a gaseous starting material for formation of a deposited film and a gaseous halogenic oxidizing agent selected from the group consisting of F$_2$, Cl$_2$, Br$_2$ and I$_2$, said gaseous halogenic oxidizing agent having the property of oxidation action on said starting material to effect chemical contact therebetween to thereby form a plural number of precursors including precursors in an excited state, said film forming space positioned adjacent and in communication with said reaction spac and said deposited film including at least one of these precursors as a constituent element thereof, said method comprising:

forming in said reaction space a first mixture of said gaseous starting material and said gaseous halogenic oxidizing agent said first mixture capable of forming said deposited film on said substrate;

introducing said mixture into said film forming space to effect the formation of said deposited film to a desired thickness on said substrate;

increasing the amount of said gaseous halogenic oxidizing agent relative to the amount of said gaseous starting material to form a second mixture in said reaction space capable of effecting an etching action of the surface of said deposited film; and introducing said second mixture into said film forming space to effect said etching action on said deposited film.

12. A method for preparing a semiconductor device having at least one layer of a semiconductive deposited film on a substrate which comprises:

forming in a reaction space a first mixture of a gaseous starting material for formation of a deposited film and a gaseous halogenic oxidizing agent selected from the group consisting of F$_2$, Cl$_2$, Br$_2$ and I$_2$, said gaseous halogenic oxidizing agent having the property of oxidation action on said starting material to effect chemical contact therebetween to thereby form a plural number of precursors including precursors in an excited state, said reaction space positioned adjacent and in communication with a film forming space, said first mixture capable of forming said deposited film on said substrate;

introducing said first mixture into said film forming space to effect the formation of said deposited film;

increasing the amount of said gaseous halogenic oxidizing agent relative to the amount of said gaseous starting material to form a second mixture capable of effecting an etching action by an oxidative reaction on said deposited film; and introducing said second mixture into said film forming space so as to contact said deposited film in a limited region and effect said etching thereon in a desired pattern.

* * * * *

UNITED STATES PATENT AND TRADEMARK OFFICE
CERTIFICATE OF CORRECTION

PATENT NO. : 4,842,897
DATED : June 27, 1989
INVENTOR(S) : EIJI TAKEUCHI, ET AL.

Page 1 of 3

It is certified that error appears in the above-identified patent and that said Letters Patent is hereby corrected as shown below:

IN [56] REFERENCES CITED

FOREIGN PATENT DOCUMENTS, "203086 7/1980 United Kingdom" should read --2038086 7/1980 United Kingdom--.

IN [57] ABSTRACT

Line 9, "position" should read --positioned--.

COLUMN 1

Line 57, "is form" should read --is best to form--.

COLUMN 2

Line 46, "smoothen" should read --smooth--.
    Line 50, "smoothing the" should read --smoothing, in the--.

COLUMN 3

Line 3, "a" should read --an--.
    Line 52, "chamber contact" should read --chamber without having contact--.

COLUMN 7

Line 5, "1/20-50/1" should read --1/20 to 50/1--.
    Line 21, "pressure" should read --pressures--.

UNITED STATES PATENT AND TRADEMARK OFFICE
CERTIFICATE OF CORRECTION

PATENT NO. : 4,842,897

DATED : June 27, 1989

INVENTOR(S) : EIJI TAKEUCHI, ET AL.

It is certified that error appears in the above-identified patent and that said Letters Patent is hereby corrected as shown below:

COLUMN 10

Line 27, "between," should read --between--.
Line 37, "30 min tes," should read --30 minutes,--.

COLUMN 12

Line 5, "closed. And" should read --closed and--.
Line 57, "a-Si:Ge:O:H:F:B," should read
--a-Si:Ge:O:H:F:B,--.
Line 58, "a-Si:O:H:F:B," should read --a-Si:O:H:F:B,--.

COLUMN 13

Line 35, "image defect" should read --image defects--.

COLUMN 14

Line 57, "prepare" should read --prepared--.

COLUMN 16

Line 27, "a" should read --an--.
Line 39, "device" should read --devices--.

COLUMN 17

Line 8, Close up right margin.
Line 9, Close up left margin.
Line 20, "schimatically" should read --schematically--.

UNITED STATES PATENT AND TRADEMARK OFFICE
CERTIFICATE OF CORRECTION

PATENT NO. : 4,842,897
DATED : June 27, 1989
INVENTOR(S) : EIJI TAKEUCHI, ET AL.

Page 3 of 3

It is certified that error appears in the above-identified patent and that said Letters Patent is hereby corrected as shown below:

COLUMN 18

Line 27, "smoothening" should read --smoothing--.

COLUMN 21

Line 34, "a" should read --an--.

COLUMN 23

Line 47, "claim 3," should read --claim 2,--.

COLUMN 24

Line 19, "spac" should read --space--.
Line 24, "agent" should read --agent,--.
Line 26, "said mixture" should read --said first mixture--.

Signed and Sealed this

Fourth Day of December, 1990

*Attest:*

HARRY F. MANBECK, JR.

*Attesting Officer*  *Commissioner of Patents and Trademarks*